United States Patent [19]

Pirsch

[11] 4,420,771
[45] Dec. 13, 1983

[54] TECHNIQUE FOR ENCODING MULTI-LEVEL SIGNALS

[75] Inventor: Peter Pirsch, Hanover, Fed. Rep. of Germany

[73] Assignee: Bell Telephone Laboratories, Incorporated, Murray Hill, N.J.

[21] Appl. No.: 232,701

[22] Filed: Feb. 9, 1981

[51] Int. Cl.³ .......................... H04L 3/00; H04N 7/12
[52] U.S. Cl. ............................ 358/261; 340/347 DD; 358/133
[58] Field of Search ... 340/347 DD, 347 M, 347 AD; 358/133, 260, 261, 135

[56] References Cited

U.S. PATENT DOCUMENTS

| | | | |
|---|---|---|---|
| 3,483,317 | 12/1969 | De Groat | 358/261 X |
| 4,121,259 | 10/1978 | Preuss et al. | 358/261 |
| 4,163,260 | 7/1979 | Hisao et al. | 358/261 |
| 4,168,513 | 9/1979 | Hains et al. | 358/261 |

Primary Examiner—T. J. Sloyan
Attorney, Agent, or Firm—Barry H. Freedman

[57] ABSTRACT

A series of words each representing one of at least M (M≧3) different values is encoded by grouping the words into alternate runs of (1) a first, frequently occurring value, and (2) all other values. A coded representation of each run length as well as a representation of the non-frequent values which make up every other run are then combined in a predetermined sequence. Different code tables may be used to generate code words for each type of information.

17 Claims, 3 Drawing Figures

TECHNIQUE FOR ENCODING MULTI-LEVEL SIGNALS

TECHNICAL FIELD

The present invention relates generally to a technique for encoding multi-level signals and, in particular, to a form of run-length coding of such signals when one of the levels occurs much more frequently than all of the other possible levels.

BACKGROUND OF THE INVENTION

Numerous advances have been made in the efficiency with which still or moving picture information may be encoded, based upon the recognition that much information represented in a scene, in graphics or in text, is highly correlated. For example, it is possible to very accurately predict the intensity value (or other characteristics) of a particular portion of a picture, based perhaps upon spatial or temporal relationships, or other known properties of pictures, such as luminance/chrominance relations or by using velocity/displacement compensation. These predictions, in turn, are usually compared with the actual picture signal, so that only the error values need be encoded. With more sophisticated predictions, the error values statistically tend to be smaller, allowing further processing which takes advantage of the increased entropy; numerous techniques have been developed for this purpose. For example, the error signal can be non-uniformly quantized, so that inconsequential values are discarded or de-emphasized and important values emphasized. Since errors usually occur in spurts (near "non-predictable" edges, for example) various adaptive techniques can also be used, depending upon which area of the picture is being processed. Alternatively, the error signal can be processed to take advantage of spatial redundancy by a technique known as bit-plane encoding, wherein one or more of the most significant bits of each error sample, representing a group of contiguous picture elements, are coded as a series of run lengths, rather than individually. However, it is noted that the lower order bits of each error value are not usually highly correlated, reducing the effectiveness of the bit-plane approach.

Despite the improvements which the foregoing techniques provide, it nevertheless remains that the efficiency with which multi-level signals having a statistically "preferred" value are encoded may be increased, by reducing redundancy still further and thus reducing the amount of data needed to represent the signal. Accordingly, the broad object of the present invention is to enable more efficient encoding of a multi-level signal wherein one particular level or value occurs much more frequently than any other value. One such multi-level signal very well suited for encoding in accordance with the present invention is an error signal derived from a predictive picture encoder.

SUMMARY OF THE INVENTION

In accordance with the present invention, a series of words which represent samples of a multi-level signal to be encoded are first processed or grouped so as to form run length code words which indicate the sequence of occurrence of (1) words of a first frequently occurring predetermined value and (2) words of all remaining, less frequent values. The lengths of each type of run, called "frequent value" runs and "non-frequent value" runs, respectively, are preferably encoded using a variable length code. The magnitudes or values of words which make up the "non-frequent value" runs are also encoded, again preferably using variable length coding. However, a different code assignment can be used, if desired. The run-length codes and the non-frequent value codes are then combined in a predetermined sequence for transmission to a remote location where the original signal can be recovered.

BRIEF DESCRIPTION OF THE DRAWING

The present invention will be more fully understood from the following detailed description when read in light of the accompanying drawing in which.

DETAILED DESCRIPTION

The present invention is, in effect, a hybrid technique allowing the advantages of run-length encoding usually used only in conjunction with binary signals, to be achieved with a multi-level signal. It is most effective when the signal to be encoded contains a significant proportion (say > 50%) of words of a single value called the "frequent" value, which statistically is expected to occur most often. All other values are referred to collectively as "non-frequent" values. A particularly suitable application of the invention is in processing the output of a video encoder in which the value of each picture element is predicted using previously encoded information, and in which each prediction is compared with the true value to yield an error value. This type of predictive video encoder produces a large number of predictions which will be accurate, and thus a large number of error values will have values at or near ZERO. These form the "frequent value" inputs to the encoder of the present invention, while remaining error values form the "non-frequent" values. However, it is to be clearly understood that multi-level signals derived from other sources may be processed in accordance with the instant invention, and that advantageous results will be achieved as long as a heavy bias exists in favor of a given most frequent value.

Figure 1:
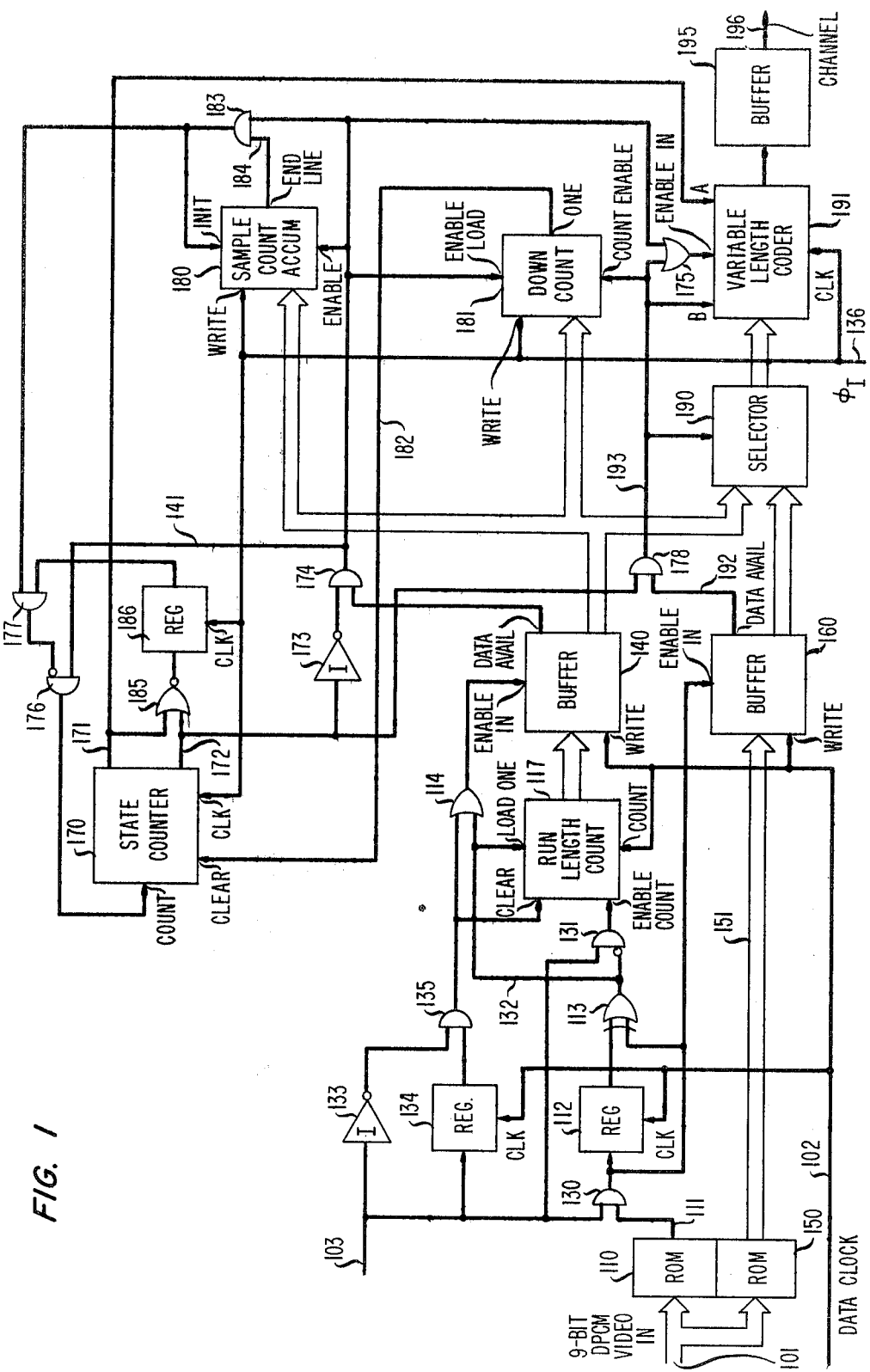
FIG. 1 is a block diagram of an encoder for multi-level input signals constructed in accordance with the present invention.

FIG. 1 is a block diagram showing an encoder arranged to encode a multi-level input signal in accordance with the present invention. A multi-level input signal such as a multibit digital signal in parallel format is applied simultaneously on line 101 to first and second read-only memories (ROM's) 110 and 150, which are shown and may be implemented as portions of a signal ROM. A clock pulse is provided on line 102 at the occurence of each input word on line 101, and a blanking signal provided on line 103 remains high during the entire period (e.g., the active portion of each line interval) when input signals are being processed. ROM 110 is arranged to provide a one-bit output on line 11, indicating whether each input word has a "frequent" value, on the one hand, or any of a plurality of remaining possible "non-frequent" values, on the other hand. Continuing the example of an input signal derived from a predictive video encoder, each word may contain 9 bits which can have only a limited number (say 16) of possible values. This limitation occurs because a quantizer is typically included within the video encoder in order to associate different groups of error values with a small number of corresponding representative values. The nine-bit word length used in the quantizer is one bit longer than the 8 bit word length typical of each input to the video encoder, to provide a sign indication, since each error can be positive or negative. The quantizer output is used in forming succeeding predictions (usually represented as 8 bit words) which in turn are compared with the corresponding 8 bit input word to yield the next 9-bit error value. A particular one of the nine-bit quantizer output words, representing the group of smallest error values, may be the "frequent value" that occurs most often, and ROM 110 may be arranged to generate a "0" (ZERO) in response to this input. On the other hand, all of the remaining 15 possible 9-bit words cause ROM 110 to generate an output of "1" (ONE), indicating a "non-frequent" value.

As long as a high blanking signal is maintained on line 103, the output of ROM 110 on line 111 is applied via AND gate 130 to a one-bit shift register 112 and to the first input of an exclusive OR gate 113 which receives its second input from the output side of register 112. The purpose of gate 113 is to signal the end of each "run" of bits output from ROM 110 by detecting a difference between its present output and the immediately preceding output stored in register 112 at the occurence of each clock pulse on line 102. When the inputs to exclusive OR gate 113 are the same, its low output is applied to an inverting input of AND gate 131, the output of which is high provided that the input on line 103 is high. The output of gate 131 in turn enables a run-length counter 117 to count clock pulses on line 102, so as to accumulate an indication of the length of each run of line values output from ROM 110. Counter 117 must have a capacity sufficient to count the number of words contained in each interval during which the blanking signal is high. For a typical line interval, a 9-bit capacity would be appropriate.

At the transition point between runs, the inputs to exclusive OR gate 113 are different, whereupon the output of gate 113 goes high. A logic signal is thus applied via OR gate 114 to the enable input of a run-length buffer 140 which is now ready to receive the run length stored in counter 117 at the instant that a clock pulse is applied to the write input of the buffer via line 102. The high output of gate 113 on line 132 also causes a "ONE" to be loaded in counter 117, so that the next run of input words may be processed.

When the blanking signal on line 103 goes low, indicating that active input signals are no longer present (at the end of each line, for example), inverter 133 and one-bit register 134 both provide high outputs, enabling AND gate 135. Its output, in turn, is passed through OR gate 114 and used to enable transfer of the multi-bit run length accumulated in counter 117 to buffer 140 when a clock pulse is received at the write input via line 102. The high output of AND gate 135 also clears counter 117 in preparation for the next series of input words.

When the output of ROM 110 is a ONE, indicating an input with a non-frequent value, the high output of AND gate 130 enables a code word output from ROM 150 to be entered in a non-frequent value buffer 160 when a clock pulse is applied to the write input of the buffer via line 102. ROM 150 is arranged to code the input word applied on line 101 by generating a fixed length (say 4-bit) code word on line 151 to represent each possible non-frequent input value. This coding removes the redundancy introduced in the input signal by virtue of the previously described quantization process. However, the code conversion performed in ROM 150 is not an essential feature of the present invention. If an input signal derived from other sources is to be encoded, ROM 150 may be eliminated and the input words applied directly to line 151. In either event, the capacity of buffer 160 must be sufficient to store the number of code words (or input words) expected in each active interval, until the blanking signal on line 103 goes low.

Information in buffers 140 and 160 is read out and encoded, on a first-in/first-out basis, under control of internal timing pulses $\phi_I$ input on line 136. These pulses are provided by an internal clock circuit, not shown, which preferably operates at a rate somewhat higher than the data clock on line 102, so that information can be encoded at least as fast as it is received in the encoder of FIG. 1. The protocol or sequence of encoding the run length information in buffer 140 and the non-frequent value information in buffer 160 must be preselected and thus known at both the encoder and decoder. For purposes of explanation, it is assumed that the desired sequence is (1) run lengths of frequent values, followed by (2) run lengths of non-frequent values, followed by (3) the non-frequent values themselves.

Supervision of the encoding sequence is provided by a two-bit state counter 170 which is initialized to provide a low output on both lines 171 and 172 at the beginning of each active interval. In this state, called the 0—0 state, the frequent value run length is to be coded. To accomplish this, the low output on line 172 is inverted in an inverter 173, and used to raise the output of AND gate 174 as long as buffer 140 has available data, as indicated by a high output on line 141. The high output of AND gate 174 serves several purposes: first, a sample count accumulator 180 is enabled to accept and accumulate the run length stored in buffer 140 at the occurrence of a $\phi_I$ pulse at its write input. Simultaneously, the same run length is entered in a down counter 181, but this counter is not otherwise used during the 0—0 state. Second, a high logic signal is applied to the "enable input" terminal of a variable length encoder 191 via OR gate 175, so that the run length held in buffer 140 may be passed through a selector switch 190 and applied to that encoder, which will be described more fully hereinafter. Finally, the high output of gate 174 enables the output of AND gate 176 to go high, causing state counter 170 to advance to its next state, called the 0-1 state, in which the run length of non-frequent values is to be encoded.

In the 0-1 state, the output of counter 170 on line 171 is high while its output on line 172 remains low. When the logic level of line 171 is raised, variable length coder 191 is signalled, enabling a change in the coding assignment used to encode the run length information. This aspect of the invention will be discussed more fully below. Since the logic level on line 172 remains low in the 0-1 state, the output of AND gate 174 remains high. In this condition, the length of the non-frequent value run is added to the previous count in accumulator 180 and also entered in down counter 181, overwriting the previous count stored therein. The high output of gate 174 again causes counter 170 to advance, this time to the third state, called the 1-0 state, in which line 172 goes high while line 171 goes low.

In the 1-0 state, the non-frequent value code words stored in buffer 160 are to be encoded. When the logic level on line 172 goes high, the output of AND gate 178 likewise goes high, since at least one non-frequent value code word has been entered in buffer 160 so as to raise the logic level on its data available output (line 192). The high output of gate 178 is passed through OR gate 175 and, as in the 0-1 state, enables coder 191 to receive inputs. However, the high output from gate 178 causes switch 190 to reposition itself so as to apply the non-frequent value codes in buffer 160 to coder 191.

While state counter 170 is in the 1-0 state allowing read out of the non-frequent value codes held in buffer 160, the outputs of AND gates 174 and 176 are low, keeping the counter from changing state. Down counter 181, which has received the run length indicating the number of non-frequent words that must be applied to coder 191 now supervises circuit operation, and the count contained therein is decreased by one each time a $\phi_I$ clock pulse is applied on line 136, indicating that another non-frequent value word has been processed. When the count in counter 181 is decreased to ONE, the logic level on line 182 rises, resetting state counter 170 to its 0—0 state with the next $\phi_I$ clock pulse, so that the entire cycle described above may be repeated.

Accumulator 180 is used to indicate the end of a processing interval which can include words derived from a single video scan line in the example given above. At the end of such a processing interval, it may be the case that the last information being processed is a frequent value run length; since it is desired that the next processing interval also start in the same state, it is thus necessary to inhibit the advancement of state counter 170. Inhibition is accomplished if counter 170 was most recently in its 0—0 state, since both inputs to NOR gate 185 are then low, producing a high output which sets a register 186 at the next $\phi_I$ pulse. This clock pulse advances counter 170 to its 0-1 state. Now, both inputs to AND gate 174 (which is high in the 0-1 state) and the other (on line 184) being high when the count in accumulator 180 indicates that the end of the processing interval has been reached. The high outputs of AND gate 183 and register 186 serve to produce a high output from AND gate 177, which is inverted, keeping the output of AND gate 176 low. This assures that counter 170 will not advance, but will remain in the 0-1 state at the beginning of the next processing interval.

When counter 170 is in a state other than the 0—0 state at the instant when accumulator 180 indicates the end of a processing interval by a high output on line 184, the inhibition mentioned above does not occur. In such case, the outputs of OR gate 185 and thus register 186 are low, so that the output of AND gate 177 is also low. This allows the output of gate 176 to go high and thus advance counter 170 as appropriate.

The output of AND gate 183 is also used to raise the logic level at the "initialize" input to accumulator 180 at the end of each processing interval. In this condition, the next run length output from buffer 140 is loaded directly into accumulator 180, rather than being added to the previous accumulator contents.

As mentioned previously, variable length encoder 191 may comprise a read-only memory capable of storing three complete sets of code words, two for representing the run lengths accumulated in buffer 140 and the third for representing the non-frequent value words accumulated in buffer 160. The particular code set or dictionary used depends upon the type of information (i.e., run length or value) that is being encoded, and for the run lengths, which type of run, i.e., frequent or non-frequent values, is involved. The actual selection of a code table or dictionary depends upon a two-bit code word coupled to coder 191 on lines 171 and 193. For convenience, the bit derived from state counter 170 on line 171 is called the "A" bit, while the bit derived from the output of AND gate 178 on line 193 is called the "B" bit. With bits A and B low, coder 191 is arranged to code frequent value run lengths, while with bit A high and bit B low, non-frequent value run lengths are coded. Finally, with bit B high and bit A low, the non-frequent value words themselves are encoded. For each case, a different code dictionary may be constructed using statistics derived from expected or typical signals. In general, short codes are assigned to most frequent expected values, and longer codes are used for less frequent values. Since the length and rate of the code words output from encoder 191 varies, its output is entered in a first in-first out buffer 195 prior to transmission to a remote location or a storage medium via line 196.

The encoding sequence just described will be more fully appreciated by consideration of the following example. In Table 1 below, a 9-bit multi-level input as might be applied on line 101 is shown in column 1. Each word can assume any of 16 possible values, determined by the characteristics of the quantizer contained in the predictive video encoder which is the source of the input signal. Each non-frequent 9-bit word is quantized or converted to a corresponding 4-bit word in ROM 150, as shown in column 2 of Table 1, using a quantizing strategy which forms no part of the present invention. In this example, input value 000000000 is the frequent value which is not quantized or encoded. This input value causes ROM 110 to produce a ZERO output, while all other input values produce a ONE output from ROM 110, as shown in column 3.

TABLE 1

| Input (Line 101) | Output Of ROM 150 | Output Of ROM 110 | output of Counter 117 | Output of Coder 191 Using | | |
|---|---|---|---|---|---|---|
| | | | | Table 2 | Table 3 | Table 4 |
| 000000000 | | 0 | 1 | 110 | | |
| 000011001 | 0010 | 1 | | | | 000 |
| 000101010 | 0011 | 1 | 2 | | 10 | 011 |
| 000000000 | | 0 | | | | |
| 000000000 | | 0 | | | | |
| 000000000 | | 0 | 3 | 10 | | |
| 000000101 | 0001 | 1 | | | | 10 |
| 000011001 | 0010 | 1 | | | | 000 |
| 010110111 | 1010 | 1 | 3 | | 011 | 01001 |
| 000000000 | | 0 | | | | |
| 000000000 | | 0 | 2 | 000 | | |
| 000000101 | 0001 | 1 | 1 | | 000 | 000 |
| 000000000 | | 0 | 1 | 111 | | |
| 000000101 | 0001 | 1 | 1 | | 000 | 10 |
| 000000000 | | 0 | | | | |
| 000000000 | | 0 | | | | |
| 000000000 | | 0 | | | | |
| 000000000 | | 0 | | | | |
| 000000000 | | 0 | 5 | 0101 | | |

The output of ROM 110 is assembled into runs by counter 117, which essentially counts consecutive like outputs from ROM 110. Each multibit word (shown in decimal form in column 4) output from counter 117 is applied to buffer 140. In the example of Table 1, the output of ROM 110 begins with a run of value 0 and length 1, and is followed by a run of value 1 and length 2. The values of succeeding runs must, by definition, alternate, the run lengths being 3, 3, 2, 1, 1, 1, and 5 as seen from column 4.

The code word assignments used by coder 191 to represent the run lengths in column 4 can be different variable length codes for runs of value ZERO and runs of value ONE, and this arrangement is particularly useful when the run length statistics for the two values are likely to be different. However, the totality of code words used must be such that the receiver can distinguish each word from the next word. Examples of code dictionaries for ZERO and ONE run lengths are given in Tables 2 and 3 below, in which it is seen that the code words are the same but the assignments are different. The appropriate code words determined by using Tables 2 and 3 have been entered in columns 5 and 6 of Table 1. It is to be noted that a code must be provided for a run length of ZERO in Table 2 (for frequent value runs) to account for the possibility that a series of input words will begin with a non-frequent value run. In that event, the first frequent value run is assigned the code representing the ZERO length.

TABLE 2

"ZERO" RUNS

| Run Length | Code |
|---|---|
| 0 | 111 |
| 1 | 110 |
| 2 | 000 |
| 3 | 10 |
| 4 | 011 |
| 5 | 0101 |
| . | |
| . | |
| . | |

TABLE 3

"ONE" RUNS

| Run Length | Code |
|---|---|
| 1 | 000 |
| 2 | 10 |
| 3 | 011 |
| 4 | 0101 |
| 5 | 110 |
| . | |
| . | |
| . | |

The code words generated by coder 191 to represent each non-frequent value are also selected using a variable length Huffman code, another example of which is shown in Table 4 below. Appropriate code words for the example in Table 1 generated using Table 4 have been entered in column 7.

TABLE 4

| Value | Code |
|---|---|
| 0001 | 10 |
| 0010 | 000 |
| 0011 | 011 |
| 0100 | 110 |
| 0101 | 111 |
| 0110 | 0101 |
| 0111 | 00100 |
| 1000 | 00101 |
| 1001 | 01000 |
| 1010 | 01001 |
| 1011 | 00110 |
| 1100 | 001110 |
| 1101 | 00111101 |
| 1110 | 00111110 |

TABLE 4-continued

| Value | Code |
|---|---|
| 1111 | 00111111 |

From columns 5, 6 and 7 of Table 1, it will be seen that the input words of column 2, which contain a total of 76 bits, are represented by code words having a total of 47 bits, for a compression ratio of approximately 3:2. Where the present invention is used for coding actual error value sequences generated using a predictive video encoder, a compression ratio of approximately 5:2 can be expected. The compression ratio depends upon the type of input sequence.

Figure 2:
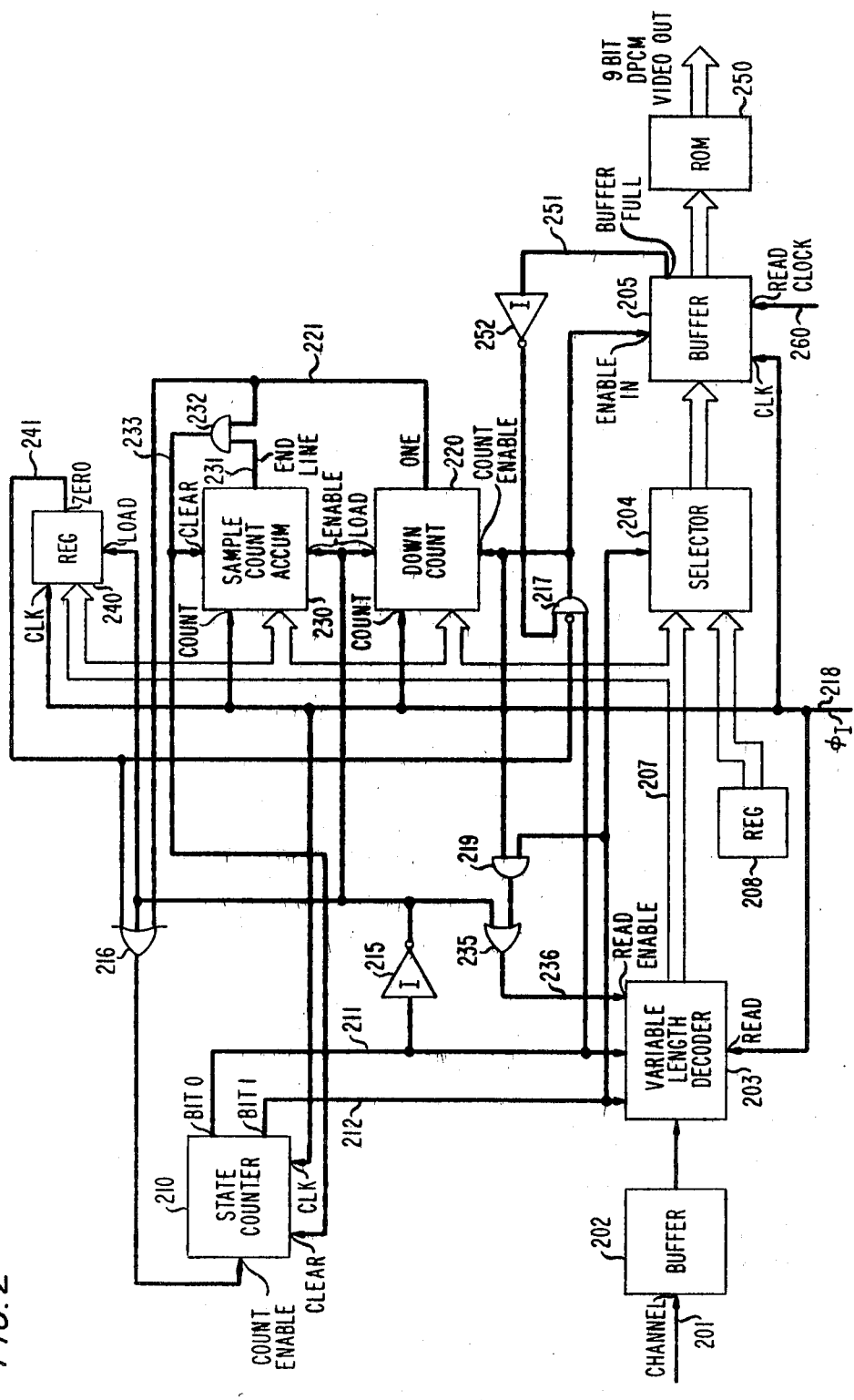
FIG. 2 is a block diagram of a decoder arranged to recover the original signal encoded by the apparatus of FIG. 1.

A multi-valued digital signal encoded with the apparatus of FIG. 1 may be returned to its original form using the decoder shown in block diagram form in FIG. 2. Incoming code words received from the transmission channel 201 are entered in a first-in, first-out buffer 202 which equalizes the transmission channel rate with the processing rate of the decoder circuitry. Data stored in buffer 202 is applied to a variable length decoder 203 which recognizes words from the serial data stream and, like encoder 191 of FIG. 1, contains a read-only memory. Decoder 203 advantageously is arranged to perform run length and value decoding under control from a state counter 210, which insures that the same protocol used in the encoder is used to recover the original signal.

Upon initialization, counter 210 is in the first of four possible states, called the 0—0 state. In this state, the outputs on lines 211 and 212 are both low, and the frequent value run length code word applied to decoder 203 is converted to the corresponding run length output on lines 207 using, for example, the code word to run length conversion in Table 2. The low output from counter 210 on line 211 is inverted by an inverter 215, and applied to the enable inputs of a down counter 220 and a sample count accumulator 230 each of which receives the frequent value run length. A register 240, for purposes described below, is also enabled to load the frequent value run length. The high output of inverter 215 is also passed through OR gate 216 to the count input of state counter 210, advancing it to its second state, called the 0-1 state, upon the ocurrence of a clock pulse $\phi_I$ applied on line 218. In this state, the output on line 211 is high while the output on line 212 stays low.

Decoder operation is now controlled by down counter 220, which enables assembly of the desired number of words each having the frequent value stored in register 208, in a second buffer 205. Entry into the buffer is enabled by a high output from an AND gate 217. Clocking is again provided by a series of clock pulses $\phi_I$ applied on line 218, generated by an internal clock not shown, which is also used to synchronize various other circuit elements.

At each occurrence of a $\phi_I$ pulse on line 218, the count in down counter 220 is decreased by one, provided that the count enable input received from AND gate 217 is high. Concurrently, a word representing the frequent value, permanently held in a register 208, is passed through selector switch 204 and entered in buffer 205. This procedure is repeated until the count in counter 221 decreases to ONE, at which time the last frequent value word is being processed, and the last such word is input to buffer 205.

When the count in counter 220 reaches ONE, a high output on line 221 is passed through OR gate 216, enabling state counter 210 to advance to its third state, called the 1-0 state, in which line 212 is high and line 211 is low. In this state, a non-frequent value run length code word is taken from buffer 202 and applied to variable length decoder 203. The corresponding run length, obtained from Table 3, is entered in down counter 220. Concurrently, the run length on line 207 is added to the count in accumulator 230.

As the run length is entered, the high output of inverter 215 is passed through OR gate 216, causing state counter 210 to advance to its final state (called the 1—1 state) in which both outputs on lines 211 and 212 are high. In the 1—1 state, the code words representing the non-frequent values are output from buffer 202 and applied to decoder 203. The non-frequent values are recovered, using the code conversion of Table 4, and applied to buffer 205 via selector switch 204, which has been repositioned by virtue of the high signal on line 212. Down counter 220 again decrements at each occurrence of an internal clock pulse on line 218, signifying entry of a non-frequent value word into buffer 205. When the count in counter 220 again reaches one, indicating that the last non-frequent value word is about to be processed, the output on line 221 goes high, resetting counter 210 to its initial 0—0 state so that the cycle described above can be repeated.

When the count in accumulator 230 indicates that the number of words processed is equal to the number of words contained in one processing interval, the output on line 231 goes high. This enables the output of AND gate 232 to go high when down counter 220 has completed its cycle and its output on line 221 also goes high. The output from AND gate 232 on line 233 is used to clear state counter 210, whereupon the entire decoding cycle will be repeated for the next processing interval. It is noted that the arrangement described starts counter 210 in its 0-0 state independent of the preceding state just completed. The output of AND gate 232 also serves to clear accumulator 230 in preparation for the next processing interval.

Register 240 is provided in the decoder of FIG. 2 in order to take account of a special situation in which the length of the first frequent value run is zero, i.e., when the first run in a processing interval is a run of non-frequent values. In this case, entry of frequent values into buffer 205 must be inhibited, and state counter 210 must be advanced. When register 240 receives the value ZERO, state counter 210 is advanced to the 0-1 state and the zero output of register 240 on line 241 goes high. This changes the state of counter 210 to the 1-0 state, since the count enable input from OR gate 216 is thus high. The high output on line 241 also serves to disable AND gate 217, preventing data from entering buffer 205 under the conditions specified above.

Variable length decoder 203 is arranged to provide the next output word each time the level on an output enable lead 236 is raised to indicate that another word is needed. Thus, each time a run length code is loaded in counter 220 and accumulator 230 using an enable input from inverter 215, the same signal is passed from inverter 215 through OR gate 235 to provide a high input on line 236. Each time a non-frequent value is entered in buffer 205, enable line 236 is raised by the action of AND gate 219. One input of gate 219 is high in the 1-0 or 1—1 state; its second input is controlled by the output of AND gate 217, which output is also used to enable buffer 205 to receive the frequent or non-frequent value. If buffer 205 becomes full, it is desirable that the operation of the decoder circuit be temporarily halted. Upon such an occurrence, a "buffer full" output on line 251 goes high, whereupon the low output of an inverter 252 acts to disable AND gate 217. Otherwise, the output of gate 217 is high in the 1—1 and 0-1 states, as desired.

The code table or dictionary used by decoder 203 is directly determined by the state of counter 210. In the 0—0 state, frequent value run-length code words are decoded using Table 2, while in the 1-0 state, non-frequent value run length code words are decoded in accordance with Table 3. The non-frequent value codes are decoded using Table 4 when counter 210 is in its 1—1 state. It is to be noted that decoder 203 does not operate in state 0-1, at which time the frequent value word held in register 208 is being entered in buffer 205.

Read-only memory 250, like read-only memory 150 of FIG. 1, is simply a digital code translator arranged, for example, to re-expand the code words output from buffer 205 to match the word length used in the display connected to the decoder output. Continuing the example discussed above, ROM 250 would be arranged to convert each 4-bit word output from buffer 205 to a corresponding 9-bit word to be applied to a DPCM decoder. Data is read out of buffer 205 by clock pulses applied on line 260 at a suitable rate.

Selector switch 204, like switch 190 of FIG. 1, may be a conventional series of semiconductor logic gates arranged to couple a selector and pass to its output one of two multibit input words, depending upon the logic state of a control input. For switch 204, the control input is derived from the output of counter 210 on line 212, and the input on line 207 is coupled to its output when the control input is high. The switch is repositioned to couple the input received from register 208 to its output when the control input is low.

Figure 3:
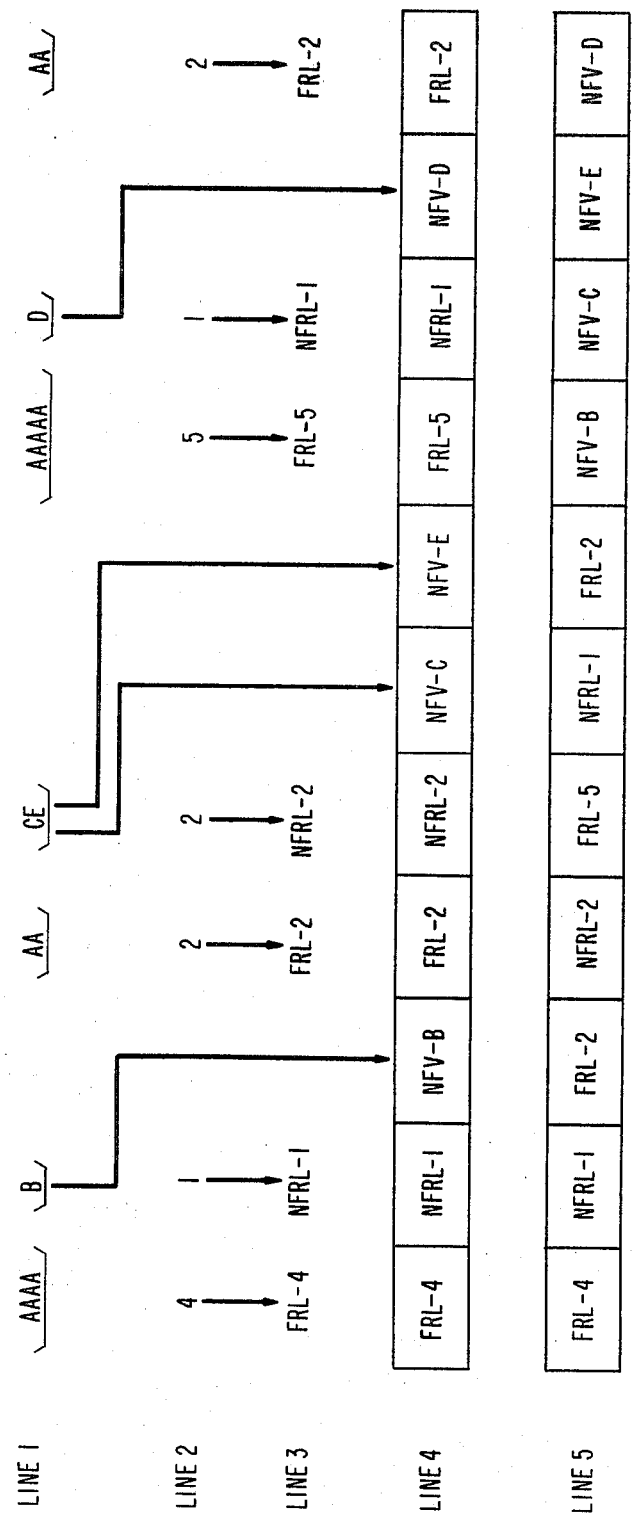
FIG. 3 is a diagram illustrating possible sequences for the code words generated in accordance with the invention.

The coding sequence used in the encoder and decoder of FIGS. 1 and 2, respectively, is illustrated in FIG. 3. A series of multibit input words having values A, B, C, D or E is input to the encoder, as shown in line 1. The words in a processing interval are grouped into runs, as shown in line 2, to separate the most frequent value A from all other less frequent values B-E. The run lengths for both frequent and non-frequent values are next coded (line 3), where FRL-n represents a code word for run length "n" derived from a first (frequent value) conversion table, while NFRL-n represents a code word for a run of length "n" derived from a second (non-frequent value) conversion table. Each set of run length codes is followed, as shown, on line 4, by a code word NFV-x, which represents the value of word "x" using yet a third conversion table.

If desired, a different order for the code words on line 4 of FIG. 3 can be used. However, the run length code words which indicate the sequence of occurrence of frequent and non-frequent values in the signal being encoded should usually precede the code words which specify the particular non-frequent values in the signal. For example, all of the run length code words for an entire processing interval can precede the non-frequent value code words for the interval, as shown in line 5 of FIG. 3. In this example, the frequent and non-frequent run length code words alternate, and are decoded at the receiver to give a count of the number of words that have been processed. When codes representing the number of words in each active interval have been accumulated, the receiver is then switched so as to decode the non-frequent value codes which follow the run length codes for that interval. These changes in the encoding protocol may necessitate corresponding changes in both the encoder and decoder circuitry, such as an increase in the buffer storage capacity. For this reason, the encoding order described above in connection with FIGS. 1 and 2 is preferred.

While the encoder and decoder in the above examples processed an input signal derived from a predictive video encoder, it is to be clearly understood that the present invention is useful with any series of input samples or words capable of having at least M different values, where $M \geq 3$. Where a binary ($M=2$) signal is to be encoded, numerous prior art run length coding techniques are available. To obtain the maximum advantage, the statistical likelihood that one of the M values will occur should be significantly greater than the statistical likelihood that any other of the values will be present. It is also to be observed that a multiplicity of code assignments can be used for the different run lengths and non-frequent values, other than the codes in Tables 2, 3 and 4.

The definition of a "run" stated previously, namely, a series of consecutive inputs having the same value, can also be modified, if desired, without diminishing the advantages of the present invention. Specifically, an alternative definition of a run may be a series of consecutive words of like value as well as the next (subsequent) word of different value. For example, for a binary input of ONE's and ZERO's, a run of ZERO's would include the ONE bit following any group of successive ZERO's, and a run of ONE bits would include the ZERO bit immediately following the successive ONE's. This alternate definition is to be understood to be within the scope of the present invention, and the means used to determine the length of successive runs including exclusive OR gate 113 and run length counter 117 of FIG. 1 would be modified accordingly. If such a different definition were used, variable length encoder 191 and decoder 203 would also be modified appropriately.

What is claimed is:

1. Apparatus for compressing samples of a multilevel communication signal, each sample having one of at least M ($M \geq 3$) different values, wherein the statistical likelihood of occurrence of a particular one of said values is much greater than the statistical likelihood of occurrence of any other of said values, including
    means for grouping said samples in runs of a first or a second type, wherein said first type runs include one or more samples of said particular value and said second type runs include one or more samples of said other values, and
    means for encoding the lengths of said runs and a representation of said other values.

2. The invention defined in claim 1 wherein said encoding means includes means for assigning a code word to each run length of said first type run using a different code dictionary than used to code the run lengths of said second type runs.

3. The invention defined in claim 2 wherein said encoding means is arranged to encode a representation of said other values using a variable length code wherein the shortest code word is associated with the most frequently occurring one of said other values.

4. Apparatus for encoding a series of samples of a multilevel communication signal each having one of at least three different values, including:
    means for generating a first series of run length code words which indicate the sequence of occurrence of (1) ones of said samples having a first one of said different values which occurs more frequently than any other of said different values, and (2) other ones of said samples having other ones of said values, and for generating a second series of code words indicating the values of said other ones of said samples, and
    means for combining said first and second series of code words.

5. The invention defined in claim 4 wherein said multilevel communication signal is an error signal derived from a predictive encoder.

6. The invention defined in claim 5 wherein run length code words in said first series which represent runs of samples of said first value are derived from a different code table than run length code words which represent samples of said other values.

7. The invention defined in claim 6 wherein said generating means is arranged to generate a variable length code word to represent the value of each of said other ones of said samples, such that the shortest code word is representative of the most frequently occurring one of said samples.

8. Apparatus for encoding a series of samples of a multi-level error signal derived from a predictive encoder, including
    means for grouping said samples so as to form alternate runs of (1) samples having the most frequently occurring predetermined value and (2) samples having all remaining, less frequently occurring values, and
    means for encoding (a) the length of each of said runs, and (b) the values of only said samples having said remaining, less frequently occurring values.

9. The invention defined in claim 8 wherein said grouping means includes (1) means for generating a one-bit code indicating the occurrence of samples with said predetermined values, and (2) means responsive to said generating means for counting consecutive like occurrences of said one-bit code.

10. A method of encoding samples of a multilevel communication signal, each sample having one of at least M ($M \geq 3$) different values, wherein the statistical likelihood of a particular one of said values is much greater than the statistical likelihood of any other of said values, including the steps of:
    grouping said samples in runs of a first or a second type, wherein said first type runs include one or more consecutive samples of said particular value and said second type runs include one or more consecutive samples of said other values, and
    generating an output signal representing said multilevel signal by encoding the lengths of said runs and a representation of said other values.

11. The method defined in claim 10 wherein said encoding step includes assigning a code word to each run length of said first type run using a different code dictionary than used to code the run lengths of said second type runs.

12. The method defined in claim 11 wherein said encoding step further includes the step of encoding a representation of said other values using a variable length code wherein the shortest code word is associated with the most frequently occurring one of said other values.

13. The method of encoding a series of samples of a multilevel communication signal, each sample having one of at least three different values, including the steps of:
generating a first series of run length code words which indicate the sequence of occurrence of (1) ones of said multilevel samples having a first one of said different values which occurs more frequently than any other of said different values, and (2) other ones of said samples, and generating a second series of code words indicating the values represented by said other ones of said samples, and generating an output signal by combining said first and second series of code words.

14. The method defined in claim 13 wherein said multilevel signal is an error signal derived from a predictive encoder.

15. A method of encoding a series of words which represent samples of a multi-level signal representing pictorial information, including the steps of:
grouping said words so as to form alternate runs of (1) words having the most frequently occurring predetermined value and (2) words having all remaining, less frequently occurring value, and
generating an output signal which represents said pictorial information by encoding (a) the length of each of said runs, and (b) the values of only said words having said remaining, less frequently occurring values.

16. The invention defined in claim 1 wherein said multilevel communication signal is an error signal derived from a predictive encoder.

17. The method defined in claim 10 wherein said multilevel communication signal is an error signal derived from a predictive encoder.

* * * * *